US005485663A

United States Patent [19]

Ochiai et al.

[11] Patent Number: 5,485,663

[45] Date of Patent: Jan. 23, 1996

[54] METHOD OF FABRICATING AN INK JET PRINT HEAD

[75] Inventors: Kuniaki Ochiai; Shigeo Komakine, both of Shizuoka, Japan

[73] Assignee: Kabushiki Kaisha Tec, Shizuoka, Japan

[21] Appl. No.: 186,634

[22] Filed: Jan. 26, 1994

Related U.S. Application Data

[62] Division of Ser. No. 853,267, Mar. 18, 1992, Pat. No. 5,311,218.

[30] Foreign Application Priority Data

Mar. 19, 1991 [JP] Japan .................................... 3-54296
Oct. 2, 1991 [JP] Japan .................................... 3-255563

[51] Int. Cl.$^6$ .............................. H01L 41/22; B41J 2/01

[52] U.S. Cl. .......................................... 29/25.35; 29/890.1

[58] Field of Search .............................. 29/25.35, 890.1, 29/DIG. 12; 310/330–333, 363; 346/140.1, 141

[56] References Cited

U.S. PATENT DOCUMENTS

| | | | |
|---|---|---|---|
| 5,003,679 | 4/1991 | Bartky et al. | 29/25.35 |
| 5,193,256 | 3/1993 | Ochiai et al. | 29/25.35 |
| 5,365,645 | 11/1994 | Walker et al. | 29/890.1 X |

FOREIGN PATENT DOCUMENTS

| | | | |
|---|---|---|---|
| 4233793 | 4/1993 | Germany | 29/890.1 |
| 5147215 | 6/1993 | Japan | 29/890.1 |

OTHER PUBLICATIONS

Lane et al "Making Multi-Ink Jet Nozzles" IBM Technical Disclosure Bulletin, vol. 17, No. 5, Oct. 1974, p. 1523.

*Primary Examiner*—Peter Vo
*Attorney, Agent, or Firm*—Oblon, Spivak, McClelland, Maier & Neustadt

[57] ABSTRACT

An ink jet print head comprises a piezoelectric plate (2) formed of a piezoelectric material, a base plate (1) formed of a nonconductive, nonelectrostrictive material having rigidity lower than that of the piezoelectric material and joined to the piezoelectric plate (2), electrodes (8) formed by depositing a metal by electroless plating over the entire bottom surfaces of a plurality of parallel grooves (3) formed through the piezoelectric plate (2) into the base plate (1) and the entire side surfaces of side walls (4) each consisting of an upper side wall (*4a*) formed in the piezoelectric plate (2) and lower side wall (*4b*) formed in the base plate (2) between the grooves (3), a top plate (10) joined to the upper surface of the piezoelectric plate (2) so as to close the upper open ends of the grooves (3) to form pressure chambers (14), and a nozzle plate (12) provided with ink jets (11) and joined to one end of the assembly of the base plate (1), the piezoelectric plate (2) and the top plate (10) so that the ink jets (11) correspond respectively to the pressure chambers (14).

4 Claims, 7 Drawing Sheets

METHOD OF FABRICATING AN INK JET PRINT HEAD

This is a division, of application Ser. No. 07/853,267, filed on Mar. 18, 1992 now U.S. Pat. No. 5,311,218.

FIELD OF THE INVENTION AND RELATED ART STATEMENT

The present invention relates to an on-demand ink jet print head and a method of manufacturing the same.

FIG. 10 shows an ink jet print head of an invention disclosed in Japanese Patent Laid-open (Kokai) No. Hei 2-150355. Referring to FIG. 10, a bottom sheet 30 having a polarity indicated by the arrows is provided with a plurality of parallel grooves 31 defined by side walls 32 and a bottom wall 33. A top sheet 35 is attached adhesively by an adhesive layer 36 to the upper ends 34 of the side walls 32 to close the open upper end of the grooves 31. Upper portions of the side surfaces of the side walls 32, namely, the side surfaces of each groove 31, of a length corresponding to substantially half the depth of the groove 31 are metallized by evaporation to form electrodes 37.

The bottom sheet 30 is held on a jig in a vacuum evaporation apparatus and parallel atomic beams of a metal are projected on one side surface of each side wall 32 of the bottom sheet 30 at an angle δ to the same side surface of each side wall 32 as shown in FIG. 11 to deposit a metal film, i.e., the electrode 37, on the side surface of each side wall 32. Then, the bottom sheet 30 is turned through an angle of 180° in a horizontal plane, as viewed in FIG. 11, and the bottom sheet 30 is subjected to the same vacuum evaporation process to deposit a metal film, i.e., the electrode 37, on the other side surface of each side wall 32. Thus, the electrodes 37 are formed by evaporation on the respective upper halves of the opposite side surfaces of each side wall 32. Metal films deposited on the upper ends 34 of the side walls 32 are removed in the next process.

The grooves 31 are closed by the top sheet 35 to form pressure chambers. Then, an ink inlet opening to be connected to an ink supply unit is formed in one end of each pressure chamber, and an ink jet through which ink is jetted is formed in the other end of the pressure chamber to complete an ink jet print head.

When voltages of opposite polarities are applied to the electrodes 37 of the two adjacent side walls 32, shearing strains as indicated by dotted lines in FIG. 10 result from a potential of a direction perpendicular to the direction of polarity of the bottom sheet 30 indicated by the arrows acting on the side walls 32. Consequently, the volume of the pressure chamber (the groove 31) between the sheared side walls 32 is reduced instantaneously and thereby the internal pressure of the pressure chamber is increased sharply to jet the ink through the ink jet.

FIGS. 12(*a*) and 12(*b*) show an ink jet print head of an invention disclosed in Japanese Patent Laid-open (Kokai) No. Sho 63-247051. Referring to FIG. 12(*a*), a bottom wall 38, a hard side wall 39, a top wall 40 and an actuator 41 are combined so as to form a passage 42. The actuator 41 is formed of a piezoelectric ceramic and is polarized in a direction along a Z-axis. A strip seal 43 is attached to the upper end of the actuator 41 so as to be held between the actuator 41 and the top wall 40. The lower end of the actuator 41 is joined to the bottom wall 38. Electrodes 44 and 45 are formed on the opposite side surfaces of the actuator 41. A nozzle 46 is provided at the front end of the passage 42. When ink is supplied from an ink supply unit into the passage 42 and an electric field is applied to the electrodes 44 and 45, the actuator 41 is strained as shown in FIG. 12(*b*) to compress the passage 42 and, consequently, the ink 46 is jetted through the nozzle 46.

The ink jet print head disclosed in Japanese Patent Laid-open (Kokai) No. Hei 2-150355 has the following four disadvantages.

First, the side walls 32 cannot sufficiently be strained (deformed). The side wall 32 is strained by an electric field of a direction perpendicular to the direction of polarization of the bottom sheet 30 created by applying a voltage across the opposite electrodes 37 formed on the opposite side surfaces of the groove 31. Then, the strain of the upper half portion of the side wall 32 provided with the electrodes 37 is sustained by the lower half portion of the same not provided with any electrode 37. Accordingly, the lower half portion of the side wall 32 acts as a resistance against the straining of the upper half portion of the same side wall 32. Since the side wall 32 is a solid body formed of single material (piezoelectric material) and having a high rigidity, it is impossible to strain the side wall 32 greatly and hence the variation in the volume of the pressure chamber is relatively small.

Secondly, the ink jet print head requires a costly process for forming the electrodes 37. Since the electrodes 37 must be formed only in the upper half portions of the side surfaces of the side walls 32, a special vacuum evaporation apparatus having a complicated construction must be used for forming the electrodes 37. Furthermore, the process of forming the electrodes 37 must be carried out in a plurality of steps of projecting the parallel atomic beams of a metal on one side surface of each side wall 32 at the predetermined angle δ to the side surface to form the electrode 37 on one side surface of each side wall 32, turning the bottom sheet 30 through an angle of 180° in a horizontal plane, and projecting the parallel atomic beams of a metal again on the other side surface of each side wall 32 at the predetermined angle δ to the side surface to form the electrode 37 on the other side surface of each side wall 32.

Thirdly, it is impossible to apply an electric field uniformly to the bottom sheet 30 formed of a piezoelectric material. A piezoelectric work for forming the bottom sheet 30, in general, is a sintered work consisting of crystal grains. Therefore, crystal grains appear in the side surfaces of the grooves 31 finished by grinding to form irregularities in the side surfaces of the groove 31. On the other hand, in forming the electrodes 37, no metal is deposited on portions of the side surfaces of the grooves 31 not facing directly to the atomic beam projecting source of the vacuum evaporation apparatus. Accordingly, the metal is deposited only on projections in the ground side surfaces of the grooves 31 and pinholes are formed at positions corresponding to pits between the projections, which makes it impossible to apply an electric field uniformly to the bottom sheet 30.

Fourthly, the ground side surfaces of the grooves 31 are subject to the corrosive action of the ink and hence the ground side surfaces of the grooves 31 must be coated with a protective film, which, however, is difficult. The ground side surfaces of the grooves 31 of the sintered bottom sheet 30 consisting of crystal grains is subject to the corrosive action of the ink. However, it is possible to coat the side surfaces of the groove 31 partially with the electrodes 37 having many pinholes, and hence the electrodes 37 are unable to serve as satisfactory protective films.

The ink jet print head disclosed in Japanese Patent Laid-open (Kokai) No. Sho 63-247051 has disadvantages likewise.

Firstly, many strip seals 43 having a shape corresponding to the sectional shape of the actuators 41 must be attached to the upper ends of the actuators 41, which requires much time and labor.

Secondly, although the inner surfaces of the bottom wall 38, the hard side wall 39 and the actuator 41 are exposed to the ink, no protective measure is taken to protect the inner surfaces from the corrosive action of the ink. The top wall 40 can be formed of a corrosion-resistant material chosen among relatively many possible materials and the surface of the plate-shaped top wall 40 can relatively easily be coated with a protective film. However, the bottom wall 38, the hard side wall 39 and the actuator 41 are formed by forming the passage 42 in a solid piezoelectric ceramic block, and the electrode 45 must be formed on the inner surface of the actuator 41. Only a possible process of forming the electrode 45 on the inner surface of the actuator 41 may be, in view of the size of the passage 42, is a vacuum evaporation process or a sputtering process. Accordingly, pinholes are formed inevitably in the electrode 45. The bottom wall 38 and the hard side wall 39 are exposed to the corrosive action of the ink. Such problems may be solved if the inner surfaces are coated with a protective film. However, it is impossible to coat the irregular inner, surfaces of the bottom wall 38, the hard side wall 39 and the actuator 41 entirely with a protective film by an ordinary vacuum evaporating process or a sputtering process, because the metal is deposited only on surfaces directly facing the source metal.

OBJECT AND SUMMARY OF THE INVENTION

Accordingly, it is a first object of the present invention to provide an ink jet print head provided with pressure chambers having a large volume contraction ratio.

A second object of the present invention is to provide an ink jet print head facilitating the formation of electrodes therein.

A third object of the present invention is to provide an ink jet print head provided with electrodes having few pinholes.

A fourth object of the present invention is to provide an ink jet print head having pressure chambers defined by surfaces effectively coated with a protective film.

An ink jet print head in a first aspect of the present invention comprises: a piezoelectric plate formed of a piezoelectric material, polarized in the direction of its thickness and provided with a plurality of slots separated from each other by upper side walls; a base plate formed of a nonconductive, nonelectrostrictive material having rigidity lower than that of the piezoelectric material forming the piezoelectric plate, provided with grooves separated from each other by lower side walls and joined to the piezoelectric plate so that the grooves are aligned respectively with the slots of the piezoelectric plate and the lower side walls are connected respectively to the upper side walls to form side walls to form pressure chambers; a plurality of electrodes each formed over the entire bottom surfaces and the side surfaces of the side walls; a top plate joined to the upper surface of the piezoelectric plate so as to seal the pressure chambers; and a nozzle plate provided with a plurality of ink jets and joined to one end of the assembly of the base plate, the piezoelectric plate and the top plate so that the ink jets correspond respectively to the pressure chambers. The volume of the pressure chamber is reduced to increase the internal pressure of the pressure chamber to jet the ink through the ink jet by applying a voltage to the electrodes so that the side walls of the pressure chamber are deformed.

Since the upper side wall, i.e., one portion of the side wall on the side of the top plate, is formed of the piezoelectric material having a high rigidity and the lower side wall, i.e., the other portion of the side wall on the side of the base plate, is formed of a material having a rigidity lower than that of the piezoelectric material, the resistance of the lower side wall against the deformation of the upper side wall is relatively low, so that the side wall is able to be deformed greatly to jet the ink effectively. Since the respective lower side walls of the side walls defining each pressure chamber are formed of a nonelectrostrictive material, only the upper side walls of the side walls formed of the piezoelectric material can be subjected to the action of an electric field even if the electrode is formed over the entire surfaces of the side walls defining the pressure chamber. Accordingly, a complicated process of forming an electrode only in a portion of the surfaces defining the pressure chamber can be eliminated.

An ink jet print head in a second aspect of the present invention comprises: a piezoelectric plate formed of a piezoelectric material, polarized in the direction of its thickness and provided with a plurality of slots separated from each other by upper side walls; a base plate formed of a nonconductive, nonelectrostrictive material having rigidity lower than that of the piezoelectric material forming the piezoelectric plate, provided with parallel grooves separated from each other by lower side walls, and joined to the piezoelectric plate so that the grooves are aligned respectively with the slots of the piezoelectric plate and the lower side walls are connected respectively to the upper side walls to form side walls and pressure chambers; electrodes formed over the entire bottom surfaces of the grooves and the entire side surfaces of the side walls by electroless plating; a top plate joined to the upper surface of the piezoelectric plate so as to seal the pressure chambers; and a nozzle plate provided with a plurality of ink jets and joined to one end of the assembly of the base plate, the piezoelectric plate and the top plate so that the ink jets correspond respectively to the pressure chambers. The slots of the piezoelectric plate and the grooves of the base plate are formed by grinding after joining together the piezoelectric plate and the base plate so that the internal structure of the nonelectrostrictive material forming the base plate is exposed in the ground surfaces of the grooves. Accordingly, both the surfaces of the slots of the piezoelectric plate and the base plates can simultaneously be subjected to pretreatment and electroless plating in forming the electrodes and hence the electrodes can be formed by electroless plating at a reduced cost. Since the electrodes formed by electroless plating have few pinholes and a uniform thickness even if the ground surfaces of the grooves are irregular, an electric field can uniformly be applied to the piezoelectric plate. Since the electrodes having few pinholes can be formed over the entire surfaces defining the pressure chambers, the surfaces defining the pressure chambers can be protected from the corrosive action of the ink and any additional protective film can be omitted to curtail the cost of the ink jet print head.

An ink jet print head in a third aspect of the present invention is similar in construction to the ink jet print head in the second aspect of the present invention. This ink jet print head employs a plastic substrate formed of plastic containing a catalyst for electroless plating. The catalyst promotes the deposition of the metal to improve the adhesion of the electrodes formed by electroless plating to the base plate and the piezoelectric plate.

An ink jet print head in a fourth aspect of the present invention is similar in construction to the ink jet print head in the second aspect of the present invention. A plurality of grooves are formed through the piezoelectric plate into the base plate by grinding, a catalyst for electroless plating is applied to the surfaces of the grooves, a mask covering portions of the surface of the piezoelectric plate other than those in which the electrodes and a wiring pattern of conductive film are to be formed is formed by a photolithographic process, the assembly of the piezoelectric plate and the base plate is immersed in an electroless plating bath to form the electrodes and the wiring pattern of a conductive film simultaneously. Accordingly, the steps of forming the electrodes and the wiring pattern are reduced.

DETAILED DESCRIPTION OF THE PREFERRED EMBODIMENTS

An ink jet print head in a first embodiment according to the present invention will be described with reference to FIGS. 1 to 9. First, referring to FIG. 3(*a*), a piezoelectric plate 2 formed of a piezoelectric material and polarized in the direction of its thickness is joined adhesively with an adhesive to the upper surface of a base plate 1 formed of a nonconductive, nonelectrostrictive material having a rigidity lower than that of the piezoelectric material forming the piezoelectric plate 2. The nonconductive, nonelectrostrictive material forming the base plate 1 employed in this embodiment is a liquid crystal polymer (ZAITER®, Nippon Sekiyu Kagaku K.K.). The adhesive is a nonconductive industrial adhesive. Bubbles contained in the adhesive reduces the adhesive strength of the adhesive and hence, if necessary, the adhesive is deaerated. The thickness of the film of the adhesive is, desirably, on the order of 1 μm. The characteristics of the piezoelectric plate 2 is deteriorated if the same is heated above a predetermined temperature because the piezoelectric plate 2 is polarized. Therefore, in adhesively joining together the base plate 1 and the piezoelectric plate 2, an adhesive capable of hardening at a hardening temperature that will not deteriorate the characteristics of the piezoelectric plate 2 is desired. The adhesive employed in this embodiment is SCOTCH WELD 1838B/A® (Sumitomo 3M K.K.).

Figure 3A:
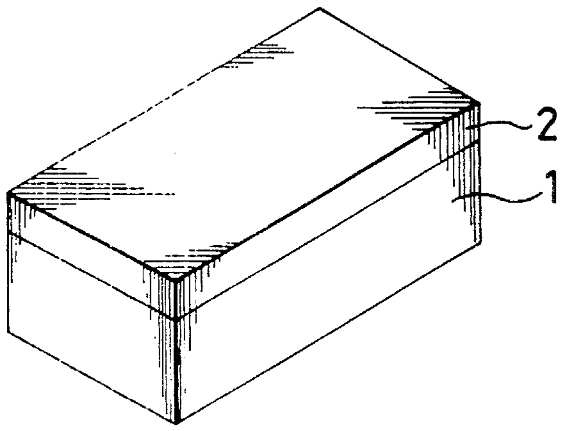
FIGS. 3(*a*), 3(*b*) and 3(*c*) are perspective views of assistance in explaining steps of fabricating the ink jet print head of FIG. 1.
Figure 3B:
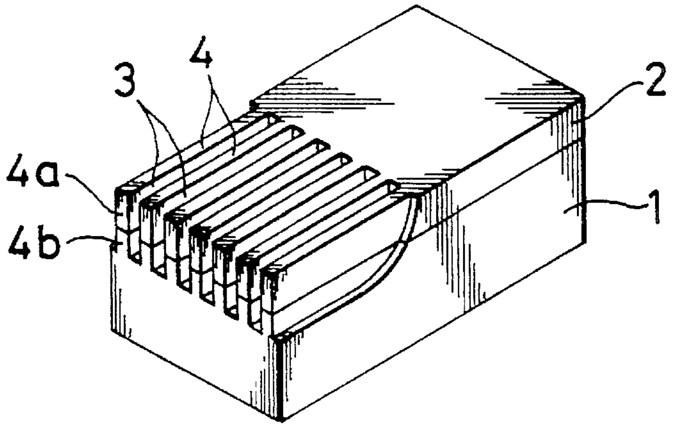
Figure 3C:
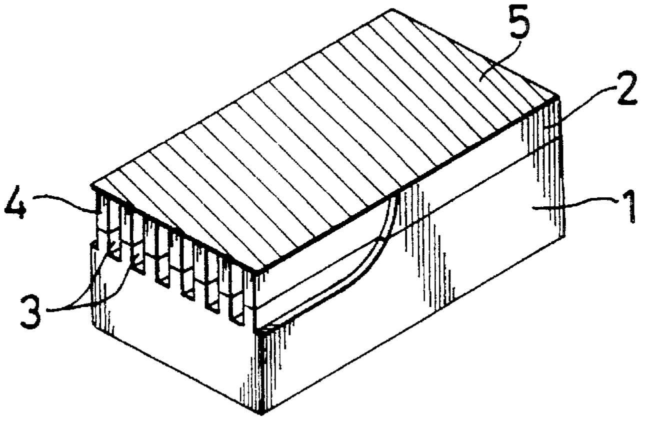

Referring to FIG. 3(*b*), a plurality of parallel grooves 3 are formed at predetermined intervals through the piezoelectric plate 2 and in the base plate 1 by grinding. Before forming the grooves 3 by grinding, the bottom surface of the base plate 1 is ground with reference to the surface of the piezoelectric plate 2 to finish the assembly of the base plate 1 and the piezoelectric plate 2 in a predetermined thickness, the base plate i is fixed to the bed of a grinding machine, and the feed of the grinding machine is determined with reference to the surface of the bed to form the grooves 3 in a predetermined depth. Naturally, the depth of the grooves 3 may be determined with reference to the surface of the piezoelectric plate 2 to omit the process of grinding the bottom surface of the base plate 1. The grooves 3 are separated from each other by side walls 4. Each side wall 4 consists of an upper side wall **4*a* formed of the piezoelectric material of the piezoelectric plate 2, and a lower side wall 4*b* having a rigidity lower than that of the upper side wall 4*a*. The grooves 3 are 80 μm in width and 160 μm in depth, and the pitch of the grooves 3 is 169 μm. Generally, a diamond wheel employed in a dicing saw for dicing wafers to provide IC chips is used for forming the grooves 3. In this embodiment, a 2 in. diameter diamond wheel NBCZ1080® or NBCZ1090® (K.K. Disuko) is used. The diamond wheel is rotated at 30,000 rpm in forming the grooves 3. Since the base plate 1 is formed of the liquid crystal polymer, the grooves 3** can be formed without forming any burr.

The work consisting of the base plate 1 and the piezoelectric plate 2 is subjected to pretreatment before forming electrodes by electroless plating. The surfaces of the work is etched for thirty minutes by a potassium hydroxide solution of 30% in concentration heated at 50° C. to finish the surfaces of the grooves 3 in a roughness capable of securing a sufficiently high adhesion of the plated film to the surfaces of the grooves 3. Then, the work is subjected to a cleaning and conditioning process using a cationic surface active agent for degreasing and for improving the catalyst adsorbing property of the surfaces of the grooves 3. Then, the work is subjected to a pretreatment process for applying a catalyst to the surfaces of the work. In this pretreatment process, the work is immersed in a catalyst solution containing neutral salt, such as NaCl, Pd and Sn, the work is treated by an acid accelerator, so that only Pd as a catalyst remains over the surfaces of the work, and then the work is dried. It is desirable to employ an ultrasonic device to make the solution permeate the surfaces of the grooves 3 perfectly.

Figure 4A:
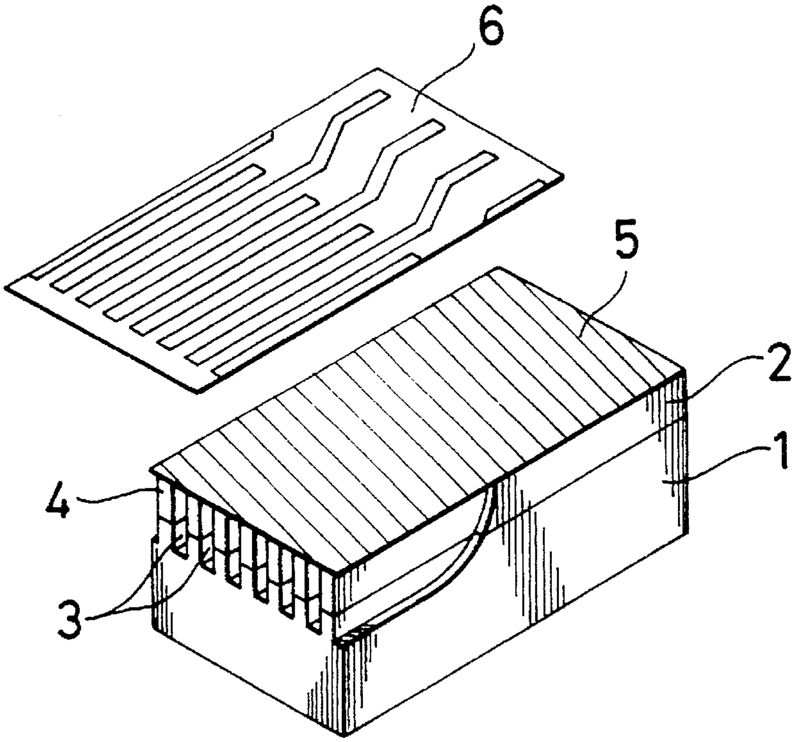
FIGS. 4(*a*) and 4(*b*) are perspective views of assistance in explaining steps of fabricating the ink jet print head of FIG. 1.
Figure 4B:
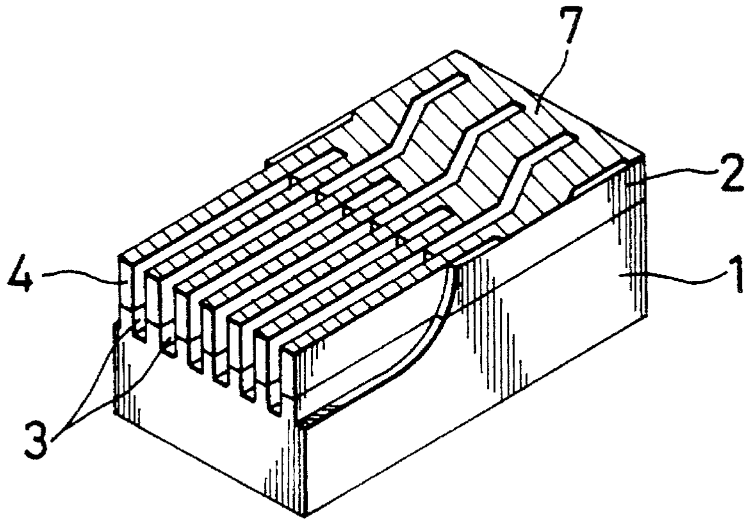

Then, a mask is formed over the surface of the piezoelectric plate 2. The mask covers portions of the surface of the piezoelectric plate 2 other than those in which electrodes and a wiring pattern of a conductive film are to be formed. A dry film 5 is formed over the surface of the piezoelectric plate 2 as shown in FIG. 3(*c*), a mask 6 is placed on the dry film 5 as shown in FIG. 4(*a*) and the dry film 5 is exposed to light and the exposed dry film 5 is subjected to developing. Resist films 7 are formed over the surface of the piezoelectric plate 2 excluding portions in which electrodes and a wiring pattern of a conductive film are to be formed. The surfaces of the portions in which electrodes and a wiring pattern of a conductive film are to be formed are coated with Pd, i.e., a catalyst.

Figure 5A:
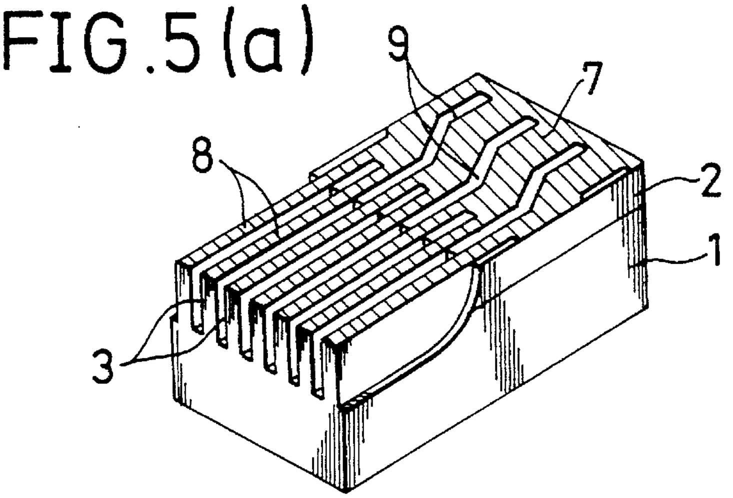
FIGS. 5(*a*), 5(*b*) and 5(*c*) are perspective views of assistance in explaining steps of fabricating the ink jet print head of FIG. 1.
Figure 5B:
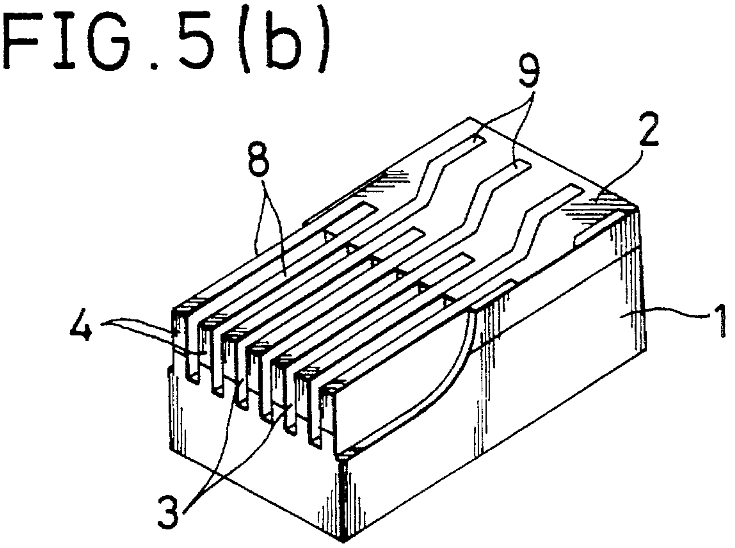
Figure 5C:
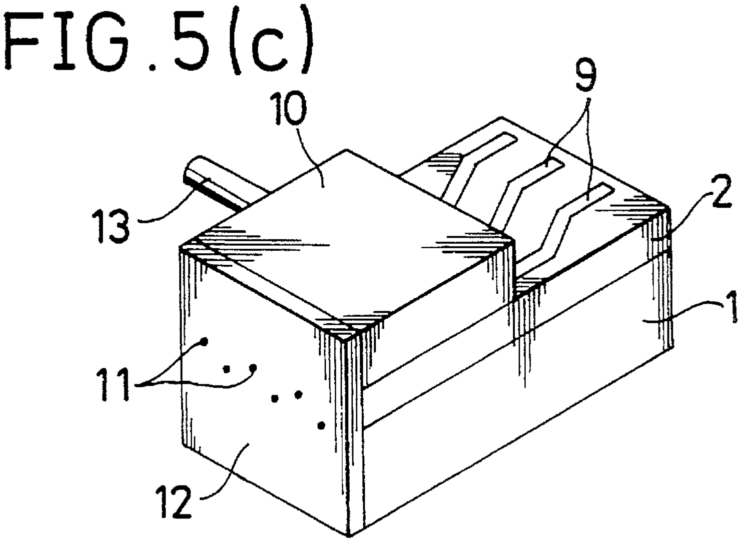

Then, the work is immersed in a plating bath for electroless plating. The portions of the surface of the work other than those in which electrodes and a wiring pattern are to be formed are isolated from the plating bath by the resist films 7. Suitable metals to be deposited by electroless plating are gold and nickel. The plating bath contains metallic salt and a reducing agent as principal components, and additives, such as a pH regulator, a buffer, a complexing agent, an accelerator, a stabilizer, a modifier and the like. In this embodiment, a low-temperature Ni-P plating bath is used. A layer of metal is formed by electroless plating in a thickness in the range of 2 to 3 μm. Since electroless plating, differing from electroplating, is a chemical process, the mode of deposition of the metal can simply be controlled by regulating the pH and the concentration of the components of the plating bath. When the work is immersed in the plating bath, Pd (catalyst) spread over the surface of the portions not coated with the resist films 7 acts as a catalyst and the metal is deposited in those portions of the surface of the work. After Pd has been coated with a film of the deposited metal, the autocatalysis of the deposited metal promotes electroless plating. When the metal is deposited in a film of a desired thickness, the electroless plating process is terminated. Thus, electrodes 8 are formed over the entire side surfaces of the side walls 4 defining the grooves 3 and not coated with the resist film 7, and a wiring pattern 9 continuous with the electrodes 8 is formed in the portions of the surface of the piezoelectric plate 2 not coated with the resist film 7 as shown in FIG. 5(*a*). Since the plating bath permeates the minute structure of the surface of the base plate 1 and the piezoelectric plate 2 and few pinholes are formed in the films of the deposited metal, the side surfaces of the side walls 4 and the film of the adhesive, which is not sufficiently resistant to water, formed between the base plate 1 and the piezoelectric plate 2 defining the grooves 3 are protected from the ink. Accordingly, any additional protective film is unnecessary. The electrodes 8 and the wiring pattern 9 are formed in a uniform thickness.

Then, as shown in FIG. 5(*b*), the resist films 7 are removed from the surface of the piezoelectric plate 2.

Figure 1:
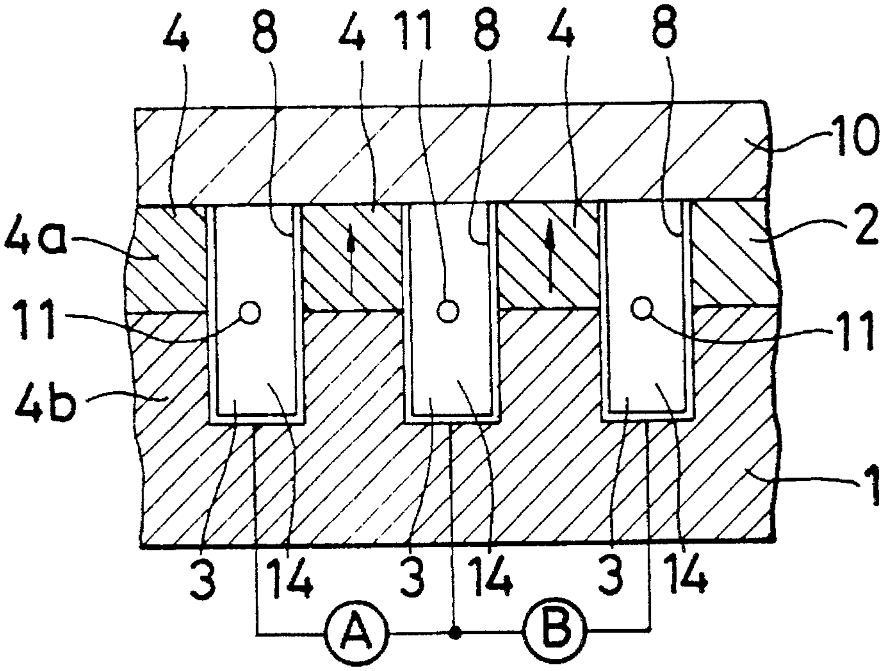
FIG. 1 is a longitudinal sectional view of an ink jet print head in a first embodiment according to the present invention.

Then, as shown in FIG. 5(*c*), a top plate 10 is attached adhesively to the upper surface of the piezoelectric plate 2. Since the resist films 7 of about 20 μm in thickness, which is thicker than the metal film formed by electroless plating, have been removed, the top plate 10 can satisfactorily be attached to the upper surface of the piezoelectric plate 2. A nozzle plate 12 provided with a plurality of ink jets 11 is attached to one end of the assembly of the base plate 1, the piezoelectric plate 2 and the top plate 10 so that the ink jets 11 correspond respectively to the grooves 3 to complete the ink jet print head. An ink supply pipe 13 is joined to the top plate 10 to connect the grooves 3 to an ink supply unit, not shown. As shown in FIG. 1, the respective upper ends of the grooves 3 are closed by the top plate 10 to form pressure chambers 14.

Operation of the ink jet print head thus constructed in jetting the ink from the middle pressure chamber 14, as viewed in FIG. 1, will be described hereinafter. The pressure chambers 14 are filled up with the ink supplied through the ink supply pipe 13 from the ink supply unit. A voltage A is applied through the wiring pattern 9 across the electrode 8 of the middle pressure chamber 14 and the electrode of the left pressure chamber 14 on the left-hand side of the middle pressure chamber 14, and a voltage B of a polarity reverse to that of the voltage A is applied through the wiring pattern 9 across the electrode 8 of the middle pressure chamber 14 and the electrode 8 of the right pressure chamber 14 on the right-hand side of the middle pressure chamber 14 to apply an electric field of a direction perpendicular to the direction of polarization indicated by the arrows to the upper side walls 4*a*. Consequently, the side wall 4 on the left-hand side of the middle pressure chamber 14 is strained to the left and the side wall 4 on the right-hand side of the middle pressure chamber 14 is strained to the right to increase the volume of the middle pressure chamber 14 and to reduce the respective volumes of the pressure chambers 14 on the opposite sides of the middle pressure chamber 14.

Figure 2:
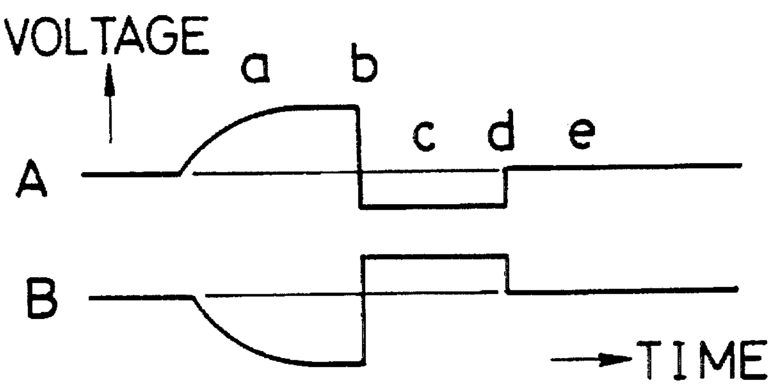
FIG. 2 is a timing chart of assistance in explaining a manner of applying a voltage to the electrode of the ink jet print head of FIG. 1.

Since the voltages A and B are increased gradually in a fixed time period a as shown in FIG. 2, the ink is not jetted through the ink jets 11 of the right and left pressure chambers 14, though the respective volumes of the right and left pressure chambers 14 are reduced. The level of the ink in the middle pressure chamber 14 is lowered slightly when the volume of the middle pressure chamber 14 is increased, and then, the ink is sucked through the ink supply pipe 13 into the middle pressure chamber 14. The polarities of the voltages A and B are reversed instantaneously at time b (FIG. 2) to strain instantaneously the side wall 4 on the left-hand side of the middle pressure chamber 14 to the right and the side wall 4 on the right-hand side of the middle pressure chamber 14 to the left. Consequently, the volume of the middle pressure chamber 14 is reduced sharply to jet the ink through the ink jet 14 of the middle pressure chamber 14. The voltages A and B of the reverse polarities are maintained for a predetermined time period c (FIG. 2). While the ink is thus jetted through the ink jet 11, the droplet of the ink jetted through the ink jet 11 is continuous with the ink jet 11. At time d, the voltages A and B are removed instantaneously from the electrodes 8 to allow the strained side walls 4 to restore their original shapes rapidly. Consequently, the internal pressure of the middle pressure chamber 14 drops sharply and thereby a rear portion of the ink droplet flying in the vicinity of the ink jet 11 is separated from the ink droplet on the axis of the ink jet 11 and is sucked into the middle pressure chamber 14. Thus, the ink droplet flies in a fixed direction and is not separated into a plurality of smaller ink droplets which form satellite dots. Although the internal pressures of the right and left pressure chambers 14 increase at the moment when the voltages A and B are removed from the electrodes 8, the internal pressures do not increase to a pressure level high enough to jet the ink through the ink jets 11.

Thus, the upper side walls 4*a* of the side walls 4 are portions of the piezoelectric plate 2 formed of a piezoelectric material having high rigidity and the lower side walls 4*b* of the side walls 4 are portions of the base plate 1 formed of a material having a rigidity lower than that of the piezoelectric material forming the piezoelectric plate 2. Therefore, the upper side walls 4*a* can be strained greatly without being obstructed significantly by the lower Side walls 4*b* to enhance the ink jetting characteristic of the ink jet print head.

Figure 6:
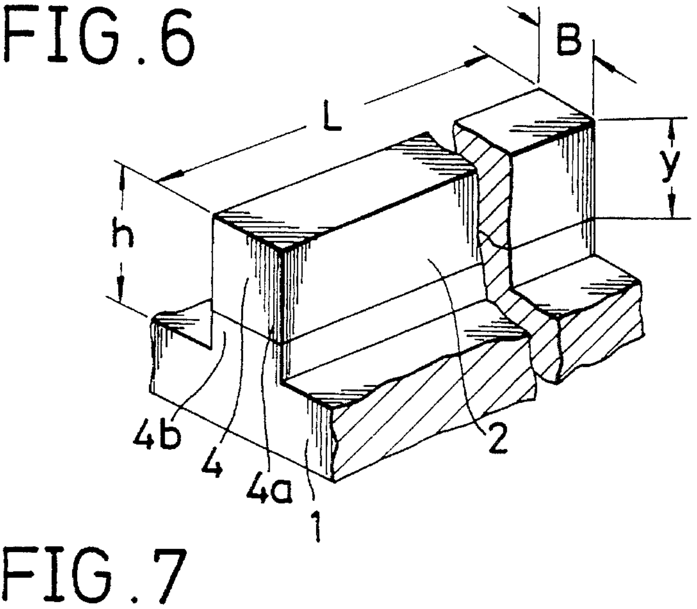
FIG. 6 is a fragmentary perspective view of assistance in explaining the dimensions of side walls of the ink jet print head of FIG. 1.

Incidentally, suppose that each side wall 4 has a height h (the depth of the groove 3) of 160 μm, a width B of 80 μm and a length L of 10 mm as shown in FIG. 6 and $$d_{15}=564\times10^{-12}\ m/V$$

$$S_{44}=37.4\times10^{-12}\ m^2/N$$

where $d_{15}$ is the piezoelectric constant of the piezoelectric plate 2 and $S_{44}$ is the elastic constant of the piezoelectric plate 2.

Figure 7:
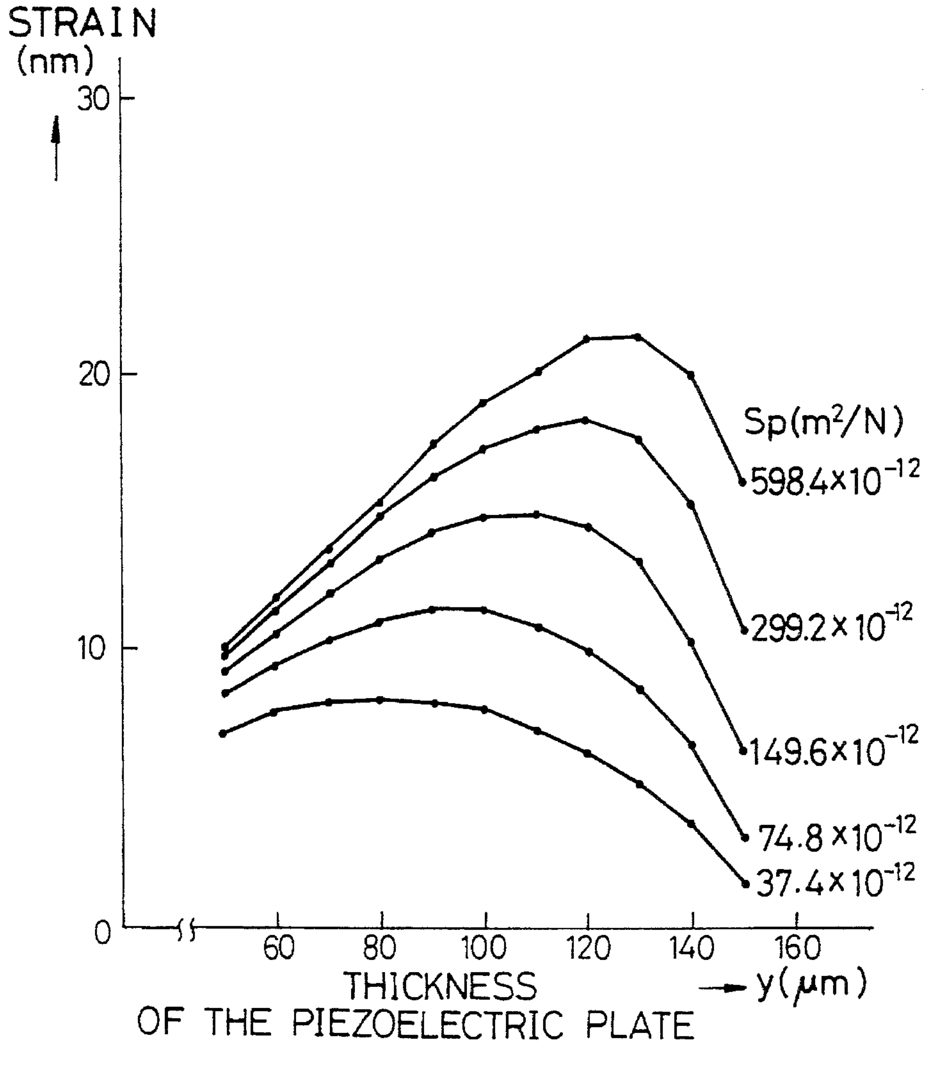
FIG. 7 is a graph showing the variation of strain in a piezoelectric plate with the thickness of the piezoelectric plate for the elastic constant of the piezoelectric plate.
Figure 8:
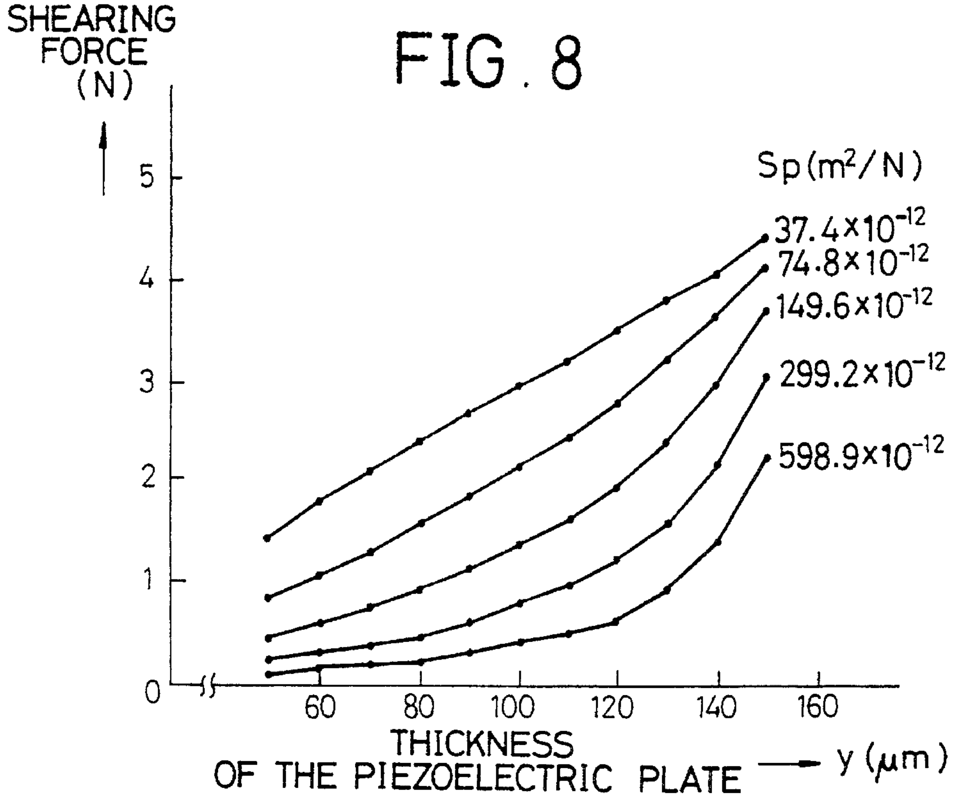
FIG. 8 is a graph showing the variation of shearing force with the thickness of the piezoelectric plate for the elastic constant of the piezoelectric plate.
Figure 9:
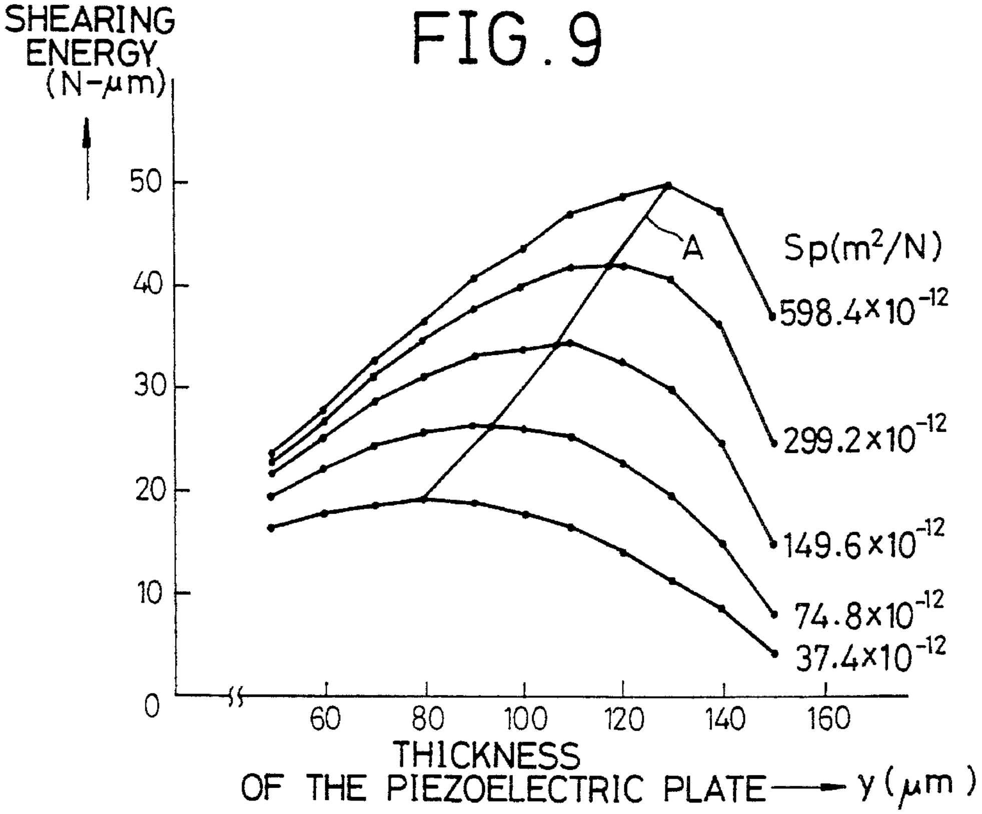
FIG. 9 is a graph showing the variation of shearing energy with the thickness of the piezoelectric plate for the elastic constant of the piezoelectric plate.
Figure 10:
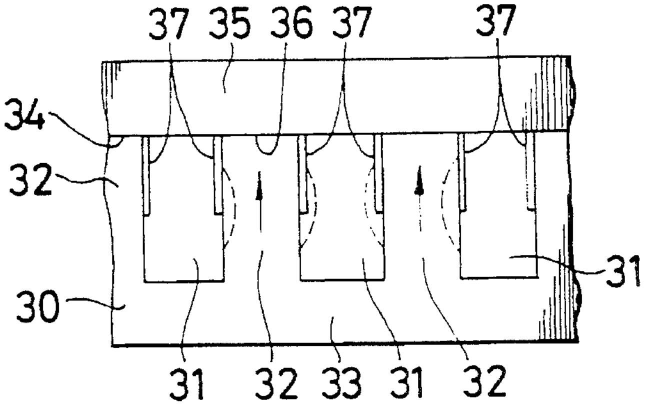
FIG.10 PRIOR ART
FIG. 10 is a longitudinal sectional view of a conventional ink jet print head.
Figure 11:
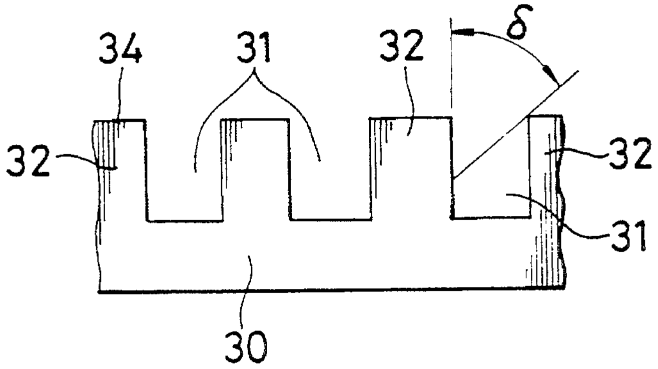
FIG.11 PRIOR ART
FIG. 11 is a side view of assistance in explaining a manner of forming electrodes.
Figure 12A:
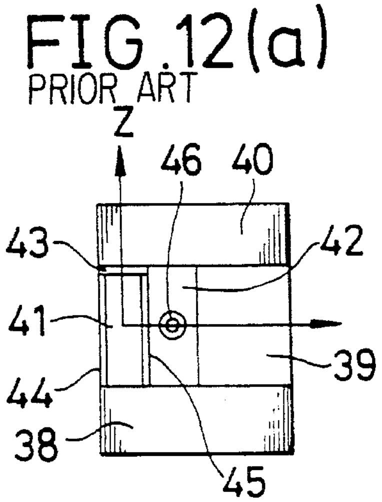
FIG.12(a) PRIOR ART
FIGS. 12(*a*) and 12(*b*) are longitudinal sectional views of another conventional ink jet print head.
Figure 12B:
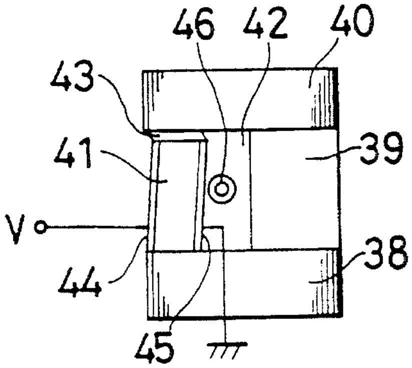
FIG.12(b) PRIOR ART

The variation of the strain of the side wall 4 (FIG. 7), the variation of shearing force acting on the side wall 4 (FIG. 8) and the variation of strain energy stored in the side wall 4 with the thickness y of the piezoelectric plate 2 (FIG. 9) for the elastic constant (the reciprocal of rigidity) of the base plate 1 will be examined, In FIGS. 7, 8 and 9, curves for $S_p=37.4\times 10^{-12}$ $m^2/N$ represent the characteristics of the side wall of the conventional ink jet print head, in which the side wall is formed entirely of the material forming the piezoelectric plate. As is obvious from FIG. 7, the strain of the side wall 4 is larger, namely, the efficiency of straining the side wall 4 is higher, for the larger elastic constant $S_p$ of the base plate 1. Thus, the elastic constant $S_p$ of the base plate 1, the height h of the side wall 4 (the depth of the groove 3) and the thickness y of the piezoelectric plate 2 are determined selectively to obtain an ink jet print head having optimum strain, shearing and energy characteristics.

Referring to FIG. 9, every energy-thickness curve for elastic constant $S_p$ of the base plate 1 has a maximum. In FIG. 9, a curve indicated at A passes the maxima of the curves. The thickness y of the piezoelectric plate 2 corresponding to the maximum is expressed as a function of the height h of the side wall 4 (the depth of the groove 3), the elastic constant $S_{44}$ of the piezoelectric plate 2 and the elastic constant $S_p$ (the reciprocal of the rigidity) of the base plate 1.

$$y=\frac{\{S_p\cdot h-\sqrt{(S_p\cdot h)^2}\ -(S_p-S_{44})S_p\cdot h^2\}}{(S_p-S_{44})}$$

The piezoelectric plate 2 is designed in a thickness approximately equal to the thickness y calculated by using this expression to obtain an ink jet print head provided with side walls 4 capable of being deformed greatly, and having an enhanced ink jet characteristic.

Since the portions of the side walls 4, namely, the lower side walls 4b, are formed of the nonelectrostrictive material, an electric field acts only on the upper side walls 4a formed in the piezoelectric plate 2 even if the electrodes 8 are formed over the bottom surfaces of the grooves 3 and the side surfaces of the lower side walls 4b, which are formed in the base plate 1. Therefore, the electrodes 8 can be formed by an electroless plating process which is less costly than an electroplating process. Electroless plating is capable of forming the electrodes 8 having few pinholes in a uniform thickness over the irregular ground surfaces of the grooves 3. Therefore, an electric field can be applied uniformly to the piezoelectric plate 2. The surfaces of the pressure chambers 14 formed in the base plate 1 and the piezoelectric plate 2 are protected from the corrosive action of the ink by the electrodes 8 having few pinholes and entirely coating the surfaces of the pressure chambers 14. Therefore, additional protective films may be omitted to reduce the cost of the ink jet print head.

In a modification, the base plate 1 was formed of a PPS resin instead of the liquid crystal polymer. The side walls 4 of the ink jet print head in this modification could be strained greatly. When the base plate 1 was formed of the PPS resin, the work consisting of the base plate 1 and the piezoelectric plate 2 was etched by an etching solution containing tin fluoride and additives at 25° C. for about thirty minutes for pretreatment before forming the electrodes 8 by electroless plating. A Ni-B plating bath was used for electroless plating.

An ink jet print head in a second embodiment according to the present invention employs a base plate 1 formed of engineering plastic containing metal powder which serves as a catalyst for electroless plating. When grooves 3 are formed in the base plate 1 by grinding, the catalyst is exposed in the surfaces of the grooves 3 and the metal is deposited on the catalyst, which enhances the adhesion of the metal deposited on the surfaces of the grooves 3. The metal powder may be Pd powder, Rh powder, Ag powder or Au powder. Satisfactory electrodes 8 can be formed by electroless plating when the PPS resin forming the base plate 1 contains 2 to 5% by weight of Pd powder of 1 μm or less grain size.

Possible materials for forming the base plate 1 are not limited to the foregoing materials; the base plate 1 may be formed of any suitable material, provided that the material is nonconductive and nonelectrostrictive, the rigidity of the material is lower than that of the material forming the piezoelectric plate 2, the base plate 1 formed of the material can be attached adhesively to the piezoelectric plate 2, the surfaces of the grooves 3 of the base plate 1 formed of the material can be finished by grinding with a diamond wheel in smooth surfaces, and the metal for forming the electrodes 8 can be deposited in high adhesion by electroless plating over the surfaces of the grooves 3 when the base plate 1 and the piezoelectric plate 2 are subjected simultaneously to electroless plating. The electrodes 8 may be formed of inexpensive Ni, however, if the Ni electrodes 8 are subject to the corrosive action of the ink, electrodes 8 may be formed of gold. To suppress an increase in cost of the ink jet print head, the electrodes 8 may be formed by depositing a Ni film and coating the Ni film with a thin film of gold.

Thus, the ink jet print head in the first embodiment according to the present invention comprises: the piezoelectric plate formed of a piezoelectric material, polarized in the direction of its thickness and provided with the plurality of parallel slots separated from each other by the upper side walls; the base plate formed of a nonconductive, nonelectrostrictive material having rigidity lower than that of the piezoelectric material forming the piezoelectric plate, provided with parallel grooves separated from each other by lower side walls and joined to the piezoelectric plate so that the grooves are aligned respectively with the slots of the piezoelectric plate and the lower side walls are connected respectively to the upper side walls so as to form side walls to form pressure chambers; the plurality of electrodes formed over the entire bottom surfaces of the grooves and the entire side surfaces of the side walls; the top plate joined to the upper surface of the piezoelectric plate so as to seal the pressure chambers; and the nozzle plate provided with the plurality of ink jets and attached to one end of the assembly of the base plate, the piezoelectric plate and the top plate so that the ink jets correspond respectively to the pressure chambers. The side walls are deformed by applying voltages across the electrodes so as be reduce the volume of the pressure chamber to increase the internal pressure of the pressure chamber, so that the ink is jetted through the ink jet. Since a portion, i.e., the lower side wall, of each of the side walls on the opposite sides of the pressure chamber is formed of a nonelectrostrictive material, an electric field can be applied only to the other portion, i.e., the upper side wall, of the side wall even if the electrodes are formed over the entire side surfaces of the side walls each consisting of the upper side wall and the lower side wall. Accordingly, the complicated process for forming the electrode only on a portion of the surface of each side wall can be omitted.

The ink jet print head in the second embodiment according to the present invention comprises: the piezoelectric plate formed of a piezoelectric material, polarized in the direction of its thickness and provided with the plurality of slots separated from each other by the upper side walls; the base plate formed of a nonconductive, nonelectrostrictive material having rigidity lower than that of the piezoelectric material forming the piezoelectric plate, provided with the grooves separated from each other by lower side walls and joined to the piezoelectric plate so that the grooves are aligned respectively with the slots of the piezoelectric plate and the lower side walls are connected respectively to the upper side walls to form the pressure chambers; the electrodes formed over the entire bottom surfaces of the grooves and the entire side surfaces of the side walls by electroless plating; the top plate joined to the upper surface of the piezoelectric plate to seal the pressure chambers; and a nozzle plate provided with the ink jets and joined to one end of the assembly of the base plate, the piezoelectric plate and the top plate so that the ink jets correspond respectively to the pressure chambers. Accordingly, the side surfaces of the lower side walls formed in the nonelectrostrictive base plate and the side surfaces of the upper side walls formed in the piezoelectric plate can simultaneously be subjected to the pretreatment and the subsequent electroless plating. Thus, the electrodes can be formed at a reduced cost by electroless plating capable of forming the electrodes having few pinholes uniformly even if the ground side surfaces of the upper side walls are irregular. Therefore, an electric field can uniformly be applied to the piezoelectric plate. Furthermore, since the bottom surfaces of the grooves and the side surfaces of the side walls defining the pressure chambers can be coated entirely with the electrodes having few pinholes, the surfaces defining the pressure chambers can be protected from the corrosive action of the ink and any additional protective film need not be formed, which reduces the cost of the ink jet print head.

The ink jet print head in the third embodiment according to the present invention having the construction similar to that of the ink jet print head in the second embodiment employs the base plate formed of a plastic containing a catalyst for electroless plating. Accordingly, the electrodes having enhanced adhesion can be formed by electroless plating.

In forming the electrodes over the ground surfaces of the side walls each consisting of the upper side wall formed in the piezoelectric plate and the lower side wall formed in the base plate of the ink jet print head in the fourth embodiment according to the present invention having the construction similar to those of the ink jet print heads in the second and third embodiments, a catalyst for electroless plating is applied to the same ground surfaces, a mask is formed by a photolithographic process so as to coat portions of the surface of the piezoelectric plate, other than those in which the electrodes and the wiring pattern are to be formed, and the work consisting of the base plate and the piezoelectric plate is immersed in an electroless plating bath to form the electrodes and the wiring pattern simultaneously. Accordingly, steps of fabricating the ink jet print head can be reduced.

What is claimed is:

1. A method of fabricating an ink jet print head, comprising steps of:

joining together a piezoelectric plate formed of a piezoelectric material and polarized in a direction of its thickness and a base plate formed of a nonconductive, nonelectrostrictive material having a rigidity lower than a rigidity of the piezoelectric material forming the piezoelectric plate;

forming a plurality of parallel grooves through the piezoelectric plate into the base plate by grinding so that an internal structure of the base plate is exposed in the ground surfaces of side walls between the grooves;

forming metal layers over entire bottom surfaces of the grooves and entire side surfaces of the side walls by electroless plating to form electrodes;

joining a top plate to an upper surface of the piezoelectric plate so as to close the grooves to form pressure chambers; and attaching a nozzle plate provided with a plurality of ink jets corresponding respectively to the pressure chambers to one end of the assembly of the base plate, the piezoelectric plate and the top plate.

2. A method of fabricating an ink jet print head according to claim 1, wherein the step of forming metal layers over entire bottom surfaces of the grooves and entire side surfaces of the side walls further comprises the steps of applying a catalyst to the entire bottom surfaces of the grooves and the entire side surfaces of the side walls between the grooves, forming a mask by a photolithographic process so as to coat portions of the surface of the piezoelectric plate other than portions of the same in which the electrodes and a wiring pattern are to be formed, and immersing the assembly of the piezoelectric plate and the base plate in an electroless plating bath after forming the mask to form the electrodes and a wiring pattern simultaneously.

3. A method of fabricating an ink jet print head according to claim 2, wherein the material forming the base plate is plastic containing a catalyst for electroless plating.

4. A method of fabricating an ink jet print head according to claim 3, wherein the step of forming metal layers over entire bottom surfaces of the grooves and entire side surfaces of the side walls further comprises the steps of applying a catalyst to the entire bottom surfaces of the grooves and the entire side surfaces of the side walls between the grooves, forming a mask by a photolithographic process so as to coat portions of the surface of the piezoelectric plate other than portions of the same in which the electrodes and a wiring pattern are to be formed, and immersing the assembly of the piezoelectric plate and the base plate in an electroless plating bath after forming the mask to form the electrodes and a wiring pattern simultaneously.

* * * * *

UNITED STATES PATENT AND TRADEMARK OFFICE

CERTIFICATE OF CORRECTION

PATENT NO. : 5,485,663

DATED : January 23, 1996

INVENTOR(S) : Kuniaki OCHIAI et al.

It is certified that error appears in the above-indentified patent and that said Letters Patent is hereby corrected as shown below:

On the title page, Item [73], the Assignee should read:

--Kabushiki Kaisha TEC--

Signed and Sealed this

Seventh Day of May, 1996

Attest:

BRUCE LEHMAN

*Attesting Officer*

*Commissioner of Patents and Trademarks*